(12) United States Patent
Gybin et al.

(10) Patent No.: US 6,503,683 B1
(45) Date of Patent: Jan. 7, 2003

(54) SCREEN PRINTING STENCIL COMPOSITION WITH IMPROVED WATER RESISTANCE

(75) Inventors: Alexander S. Gybin; Kyle K. Johnson; Toshifumi Komatsu; Lawrence C. Vaniseghem, all of Duluth, MN (US)

(73) Assignee: The Chromaline Corporation, Duluth, MN (US)

( * ) Notice: Subject to any disclaimer, the term of this patent is extended or adjusted under 35 U.S.C. 154(b) by 0 days.

(21) Appl. No.: 08/469,766

(22) Filed: Jun. 6, 1995

Related U.S. Application Data

(63) Continuation of application No. 08/147,381, filed on Oct. 26, 1993.

(51) Int. Cl.$^7$ .............................................. G03F 7/004
(52) U.S. Cl. .................... 430/270.1; 430/175; 430/176; 430/308
(58) Field of Search ............................. 430/270.1, 175, 430/176, 308

(56) References Cited

U.S. PATENT DOCUMENTS

| | | | | |
|---|---|---|---|---|
| 2,811,510 A | | 10/1957 | Leubner et al. ............. | 260/67.5 |
| 3,507,846 A | | 4/1970 | Haas ........................ | 260/88.3 |
| 3,936,429 A | | 2/1976 | Seoka et al. ........... | 260/79.3 M |
| 4,220,700 A | * | 9/1980 | McGuckin et al. ......... | 430/175 |
| 4,245,027 A | | 1/1981 | Takeda et al. .............. | 430/141 |
| 4,477,552 A | | 10/1984 | Day et al. .................... | 430/175 |
| 4,515,886 A | | 5/1985 | Yamaoka et al. ........... | 430/270 |
| 4,542,088 A | | 9/1985 | Kojima et al. ............. | 430/273 |
| 4,632,897 A | | 12/1986 | Barzynski et al. .......... | 430/260 |
| 4,701,402 A | * | 10/1987 | Patel et al. .................. | 430/339 |

FOREIGN PATENT DOCUMENTS

CA          901370         5/1972

OTHER PUBLICATIONS

Chiang, et al., "Synthesis of Some Stilbazole Derivatives", *Journal of Organic Chemistry*, vol. X, pp. 21–25 (1945).

Ichimura et al., "Immobilization of Enzymes with use of Photosensitive Polymers Having the Stabilizalium Group", *Journal of Polymer Science: Polymer Chemistry Edition*, vol. 18, pp. 891–902 (1980).

* cited by examiner

*Primary Examiner*—John S. Chu
(74) *Attorney, Agent, or Firm*—Merchant & Gould P.C.

(57) ABSTRACT

The invention resides in a photosensitive composition for screen printing. Preferably, the composition of the invention comprises a polymer comprising a vinylpyridine monomer or polymer having a pyridinium salt character and a photo-reactable constituent. The resulting stencil, once dried, exposed, cured, and subjected to alkaline treatment obtains enhanced solvent/water resistance but can be reclaimed using an acidic wash. In use, the stencil provides a screen/stencil assembly or blockout utility of high structural integrity through repeated use and screen printing images of high resolution and quality.

14 Claims, No Drawings

SCREEN PRINTING STENCIL COMPOSITION WITH IMPROVED WATER RESISTANCE

This is a file wrapper continuation of application Ser. No. 08/147,381, filed Oct. 26, 1993.

FIELD OF THE INVENTION

The invention relates to polymeric preparations that can be used in screen printing processes. Further, the invention relates to a film or a liquid polymeric composition that when used in combination with aqueous alkaline liquids, such as an alkaline ink, can form sharp long-lived stencil/screen assemblies used in screen printing operations. More particularly, the invention relates to polyvinylpyridine (or pyridinium) containing films that can be cast from aqueous solutions which, after imaging and in contact with an alkaline liquid such as a screen printing ink, at a pH greater than 7, forms screen stencils with increased or improved water resistance that can be used in screen printing processes. The composition of the invention can be reclaimed from the screen using an aqueous acidic reclaiming composition.

BACKGROUND OF THE INVENTION

Images have been formed by screen printing processes for many years. In screen printing, an image is formed on a substrate by positioning a stencil comprising a given pattern in or on a finely divided mesh screen. An ink is then applied through the stencil/screen assembly onto the substrate resulting in a complementary image on the substrate. Such patterned stencils have been formed on screen constructions using a variety of techniques. Both photosensitive (negative and positive image) and non-photosensitive image forming processes have been used. The photosensitive materials used in making emulsion or film products can be solvent based or can be aqueous based. In many industries, including photostencil industries, the trend is away from solvent based materials to materials manufactured from or based on aqueous formulations. Many photosensitive film and liquid dispersions are now based on aqueous products. In a similar vein, both solvent based inks and solvent containing screen wash compositions have been used in screen printing operations. In response to demands of the market, vendors of screen printing materials have introduced water based inks. The use of water based or aqueous inks can cause images on stencils, made from water based films or aqueous emulsions, to swell or deteriorate reducing the effective lifetime of the stencil and image quality. Because these image layers formed from typically aqueous materials tend to interact with water based inks and swell, soften or otherwise deteriorate, a substantial need exists to improve the printing properties of materials derived from aqueous based systems for printing with water based inks.

BRIEF DISCUSSION OF THE INVENTION

We have found that the pH sensitivity of polymers having pendant units comprising a non-photosensitive nitrogen heterocycle, preferably a polymer comprising vinylpyridine (pyridinium), can be used to improve both photosensitive and non-photosensitive aqueous compositions and films, such as aqueous resist materials, blockout formulations and hand cut films, when used in screen printing with aqueous ink formulations. The screen printing stencil composition of the invention comprises a photosensitive polymer or photoresist material and a non-photosensitive polymer comprising pendant units comprising a nitrogen heterocycle such as a vinylpyridine and an aqueous vehicle or carrier. The invention can also be embodied in non-photosensitive compositions and methods.

Polymeric materials have been used in resist materials as both photosensitive and non-photosensitive components. Non-photosensitive components act as stabilizers, film forming agents, vehicles, pigments etc. A large variety of vinyl polymers take this role including polystyrenics, polyvinyl alcohols, polyacrylics, polyvinyl acetates; etc. In this regard pyridinium materials have also been used. Examples of photosensitive materials using pyridinium materials include the following. Leubner et al., U.S. Pat. No. 2,811,510, teach the use of light sensitive polymeric stilbazoles and salts thereof which are quaternized polyvinylpyridine materials having photopolymerizable unsaturated units. Takeda et al., U.S. Pat. No. 4,245,027, teach a light sensitive image recording material that uses a compound which on exposure to actinic radiation is capable of complexing a polyvinylpyridine material or a compound which releases a precursor capable of complexing polyvinylpyridine to form a pyridinium salt. The Takeda et al. material requires an activating exposure to appropriate wavelengths of light. Chiang et al., *Journal of Organic Chemistry*, Vol. X, pp. 21–25 (1945) teach the light sensitivity of stilbazole nuclei. Ichimura et al., *Journal of Polymer Science: Polymer Chemistry Edition*, Vol. 18, pp. 891–890 (1980), teach the reaction of the homopolymer of 2-chloroethyl vinyl ether and the copolymer of N-vinylpyrrolidone with stilbazole to form photosensitive polymers that can be used to immobilize enzymes. Borden, Canadian Patent No. 901,370, teaches photosensitive polymeric compositions containing vinyl styryl pyridinium materials insolubilized by the action of actinic radiation. Haas, U.S. Pat. No. 3,507,846, teaches methods for polymerizing vinylpyridine into polyvinylpyridine polymers. Yamaoka et al., U.S. Pat. No. 4,515,886, teach photosensitive materials useful as photoresists in the manufacture of semiconductors, transistors and other electrically active components in aqueous systems for photosensitive compositions. Day et al., U.S. Pat. No. 4,477,552, teach a use of a small amount of a non-photosensitive polyvinylpyridine (less than about 1 wt-%) as a stabilizer for water sensitive colloidal diazo-resin sensitizers. The pyridinium materials neither directly participate in the resist formation photoreactions nor provide any substantial properties to the stencil other than the stability of the diazo.

In a stencil or film, when in contact with acid, the pyridine polymer converts into a water soluble or dispersible pyridinium form. An opposite process can be easily performed by action of base. In contact with a base, the acid salt (quaternary) form of the polymer regenerates original polymer (in free amine form) that is inherently water insoluble. Such properties could be demonstrated with polyvinylpyridine (substituted or not in a homopolymer or copolymer form), quinolines, polyvinyl quinaldines, polyvinyl quinazolines and other polymers that have a nitrogen atom in a main chain or in a backbone.

The success of the use of the acid-base properties or pH solubility/sensitivity of the preferred non-photosensitive pyridinium materials in the resist to improve the image forming properties of the resist is a surprise. When contacted with acid, the pyridine nitrogen forms an amine salt. As shown below, the acid base reaction can be used to convert the polymer from a soluble pyridinium salt to a water insoluble free amine (pyridine) moiety. The insoluble pyridinium materials used at a concentration of greater than about 5 wt % hardens and improves the image.

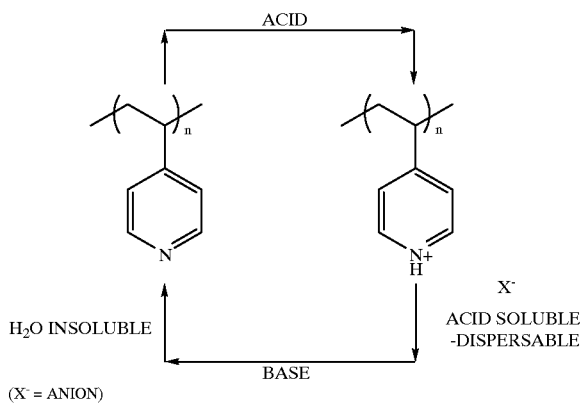

(X⁻ = ANION)

The reaction of a sufficient proportion of the pyridine moieties to form the pyridinium form renders the polymer soluble or dispersible in aqueous media. When contacted with sufficient proportions of alkaline materials, the water soluble pyridinium salt is converted to the free amine form (pyridine) which is substantially water insoluble. We have found that the alkaline character of common water-based inks cooperates with the nitrogen heterocycle in the polymeric composition in the screen stencil to improve the finished stencil. In the preferred mode of the stencil composition, the polymer comprising repeating units with the nitrogen heterocycle pendant groups can have a degree of polymerization of about 50 to 100,000. The polyvinylpyridine can be a homopolymer having a molecular weight ranging from about $10^4$ to $10^6$. The polymer comprising vinylpyridine can be formulated with other vinyl polymers, photosensitive compounds or compositions, surfactants, co-solvents, dyes, etc. The polyvinylpyridine can also be used in blockout formulations without a photosensitive material. These materials can be used in forming hand cut stencils from sheet stock comprising the polymers of the invention. Such stencils are made by first cutting into a sheet of the materials of the invention an image as desired. The cut sheet is applied to a screen and then contacted with an alkaline ink in a printing operation. The alkaline ink improves the hardness and water resistance of the film/screen.

A method of using the stencil composition of the invention includes applying or coating the photosensitive stencil composition on a screen, drying the composition, exposing the stencil (selectively imagewise) composition to actinic energy, developing the image, optionally drying the image, treating the stencil with an alkaline solution (in blockout or printing operations) or treating a dried stencil with an aqueous, alkaline ink and printing a substrate. The used stencil can be reclaimed by treating the stencil material with an acidic reclaim composition.

We have found that a variety of the problems related to stencils, masks, and photoresists used in screen printing can be solved by compounding the stencil with a heterocyclic non-photosensitive nitrogen containing polymer such as a polyvinylpyridine. Using the pH sensitive solubility of such polymers comprising a nitrogen heterocycle or a pendant vinylpyridine, a mask or stencil can be hardened or made water resistant on a screen. A minimal proportion of ink used in the printing process can result in hardening the stencil containing the polymeric materials of the invention. The ink rapidly hardens the preferred pyridinium (soluble moiety) to pyridine (insoluble moiety) at the use concentrations of the material in the photoresist. The alkaline ink acts to insolu-bilize the polyvinylpyridine and to print. To make a previously imaged and developed stencil with increased water resistance which can be used in screen printing operations, the alkaline ink can be used. When operations are completed, the screen can be contacted with an acid (i.e, an acidic reclaiming composition) and the polyvinylpyridine stencil composition can be reclaimed.

The polyvinylpyridine used in the formulations of the invention is preferably in the form of a pyridine material wherein the heterocyclic nitrogen has been reacted with an acid to form a pyridinium salt. Such polymers are substantially water soluble or dispersible and can easily be compounded with other materials in manufacture of stencils or masks on screen. The compounded stencil materials have increased water resistance as the pH of the alkaline treatment (ink or other liquid materials in contact with the stencil) increases above about 7. These materials can be rendered useful in a medium of pH>7. Preferably, the base is provided by a basic screen printing ink.

The water resistance of aqueous based photoresist materials can be improved using an aqueous polyvinylpyridine in a water soluble dispersible form, when treated with an alkaline ink. The alkaline ink further insolubilizes the imaged composition comprising the polyvinylpyridine material on the screen. The stencil image is made increasingly water resistant through the action of the base present in the ink. When the useful life of the screen/stencil assembly is at an end, the polymeric materials used in forming the image can be reclaimed by contacting the image with aqueous acidic reclaiming composition.

DETAILED DISCUSSION OF THE INVENTION

The invention can comprise an aqueous screen printing mask or stencil composition which can be insolubilized by the action of actinic light and having screen printing properties that can be further improved by a cooperation between an alkaline ink and a polymer with pendant units comprising a nitrogen heterocycle preferably a polyvinyl pyridinium composition, as well as methods of using the same, screens resulting from the use of this composition, and screen images resulting from the methods of the invention. Generally, the film of the invention or the aqueous stencil composition comprises a polymeric material such as a polyvinylpyridine constituent and a photosensitive material. The film or dispersion may also comprise a second vinyl polymer or copolymer, an acid source, and a photoreactive compound. The invention can also be used in a blockout composition or process or in a hand cut stencil. When used in blockout processes the polyvinylpyridine composition, in solution or suspension and optionally combined with other non-photosensitive components, can be applied to stencil flaws or other areas not covered by the stencil image. The applied material can be contacted with an alkaline material, insolubilizing the polyvinylpyridine in the blocked out areas. The blocked stencil can be used in standard printing operations.

The non-photosensitive polymer comprising repeating units comprising a pendant nitrogen heterocycle can be made from a monomer of the formula:

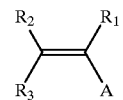

wherein the $R_1$, $R_2$ or $R_3$ are independently a lower alkyl and A is a nitrogen heterocycle including an unsubstituted or substituted pyridine moiety, a quinoline moiety, a quinazoline moiety, a quinaldine moiety etc. The heterocycle substituents are non-photoreactive.

A. Polyvinylpyridine

The preferred heterocycle containing polymer comprises a polymer made of a vinylpyridine. Suitable polyvinylpyridine polymer compositions which are preferably employed in the present invention include polymers containing at least one repeating unit derived from a polymerizable monomer selected from the group consisting of the vinylpyridine polymeric or copolymeric materials of the general formulae (I, II or III) described below. More specifically suitable polyvinylpyridines include homopolymers as shown in the formulae; copolymers of at least two different polymerizable monomers selected from the group consisting of the vinylpyridine compounds and other compatible copolymerizable pyridine monomers; and copolymers of at least one polymerizable monomer selected from the group consisting of the vinylpyridine compounds represented by the general formulae (I, II or III) described below and at least one other polymerizable monomer. Suitable addition polyvinylpyridine compounds, (polymers or copolymers) which are used can be represented by the general Formulae (IV or V) below.

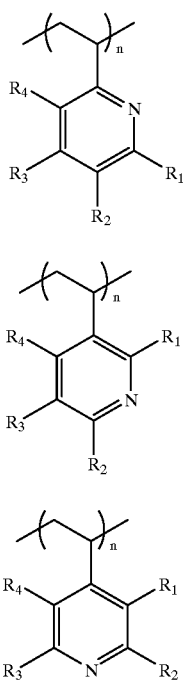

These polymers (Formulae I, II or III) are generally alkaline and insoluble in aqueous solutions at pH >7, and may be solubilized or dispersed in aqueous solution by a mild or strong, inorganic or organic acid. Examples of categories of acids that can be used include both Lewis acids and proton donor acids. Such acids can form a complex with the amine or can donate a proton to the amine group, such as the pyridine nitrogen forming a pyridinium (pyridine salt). The pyridine nitrogens can be fully or partially neutralized. Examples of suitable acids include phosphoric acid, acetic acid, sulfuric acid, hydrochloric acid, etc.

The reaction product is a water soluble or dispersible quaternary vinylpyridine polymer such as that shown in Formulae (IV, fully neutralized or V, partially neutralized).

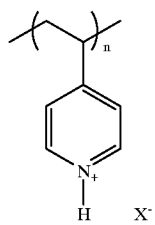

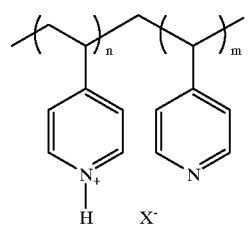

(X⁻ = ANION)

The resulting polymer comprises either a fully neutralized polyvinylpyridine or a partially neutralized polyvinylpyridine, wherein n is 50 to 100,000, having an aromatic nitrogen with an amine salt character which may be referred to as a pyridinium salt, the salt anion being a chloride or sulfate, for example. To promote solubility, the acid neutralization is generally effective to neutralize at least about 30 wt-% of the polymer. As a result, neutralization may lead to a solution or dispersion of the polymer where the compound is completely or, only partially soluble.

While not preferred, the pyridine polymers useful in the invention may be substituted on the polymer backbone or on the aromatic nucleus. In such a case, non-photoactive substituent groups ($R_1$, $R_2$, $R_3$, or $R_4$) at each of the positions may independently comprise a hydrogen atom or a straight or a branched chain alkyl group containing 1 to 7 carbon atoms (e.g., a methyl group, an ethyl group, an n-propyl group, an isopropyl group, an n-butyl group, a t-butyl group, an n-heptyl group, etc.).

Specific examples of such substituents include a hydrogen atom, a methyl group, an ethyl group, an n-propyl group, an isopropyl group and an n-butyl group.

Preferred specific examples of vinylpyridine monomers include 4-vinylpyridine, 3-vinylpyridine, 2-vinylpyridine, 2-methyl-4-vinylpyridine, 2-ethyl-5-vinylpyridine, 3-methyl-5-vinylpyridine, 3-n-butyl-5-vinylpyridine, 2-ethyl-4-vinylpyridine 3-methyl-4-vinylpyridine, 3-isopropyl-4-vinylpyridine, 2-methyl-5-vinylpyridine, and the like. Generally, preferred polymers will have a molecular weight ranging preferably from about $10^4$ to $10^6$.

B. Copolymers

The screen printing stencil composition of the invention may comprise the vinylpyridine structures shown in Formula I through V. Alternatively, the screen printing stencil composition of the invention may comprise a copolymer of the structures shown in Formula I through V and one or more comonomers.

In the case of copolymers, the copolymer may be a copolymer of two or more of the above-described vinylpyridine monomers or the copolymer may be a copolymer of one or more of the above-described vinylpyridine monomers and one or more other addition polymerizable monomers capable of copolymerizing with the above-described vinylpyridine monomers. A broad range of different copolymerizable monomers can be used. There is no restriction on the copolymerization ratio between vinylpyridine in copolymers containing only vinylpyridine monomers but in copolymers with other copolymerizable addition polymerizable monomers the mole fraction of the vinylpyridine monomer units to the total monomer units in the resulting copolymer is preferably more than about 0.3. Further, the resulting copolymer must be insolubilized due to the interaction of the pyridine moiety with the aqueous alkaline ink.

Examples of suitable addition polymerizable monomers capable of copolymerizing with the vinylpyridine polymers of the general formulae (I through V) above which can be used include mono-olefin compounds such as ethylene, propylene, butene, etc.; diene compounds such as butadiene, isoprene, chloroprene, methoxybutadiene, cyclopentadiene, 1,3-cyclohexadiene, etc.; vinyl halide compounds such as vinyl chloride, vinyl bromide, vinyl fluoride, etc.; halopropene compounds such as 2-chloropropene, 1-chloropropene, 2-fluoropropene, etc.; vinyl ether compounds such as vinyl methyl ether, vinyl ethyl ether, vinyl n-propyl ether, vinyl isopropyl ether, vinyl n-butyl ether, vinyl isobutyl ether, vinyl tert-butyl ether, vinyl neopentyl ether, vinyl 2-methoxyethyl ether, vinyl 2-chloroethyl ether vinyl 2,2,2-trifluoroethyl ether, vinyl benzyl ether, etc.; styrene compounds such as styrene, α-methylstyrene, 4-chlorostyrene, dichlorostyrene, 2,5-dimethoxystyrene, 4-methylstyrene, 4-ethylstyrene, etc.; aromatic vinyl compounds other than styrene, etc.; N-heterovinyl compounds other than the compounds represented by formulae (I) and (II) such as N-vinylcarbazole, N-vinylpyrrolidone, etc.; acrylic acid compounds such as acrylic acid, methacrylic acid, etc.; acrylic acid ester compounds such as methyl acrylate, ethyl acrylate, butyl acrylate, etc.; methacrylic acid esters such as methyl methacrylate, ethyl methacrylate, n-propyl methacrylate, n-butyl methacrylate, isobutyl, isobutyl methacrylate, n-hexyl methacrylate, 2-ethylbutyl methacrylate, n-lauryl hexyl methacrylate, 2-ethylbutyl methacrylate, n-lauryl methacrylate, 4-(tert-butyl)phenyl methacrylate, bornyl methacrylate, etc.; acrylonitrile compounds such as acrylonitrile, methacrylonitrile, etc.; acrylamide compounds such as acrylamide, N,N-dimethylacrylamide, N-(1,1-dimethyl-3-oxobutyl) acrylamide, etc., and the methacrylamides corresponding thereto; vinyl methyl ketone; methyl isopropenyl ketone; maleic anhydride; vinyl ester compounds such as vinyl acetate, vinyl chloroacetate, vinyl n-butyrate.

C. Aqueous Vehicle

Generally, the screen stencil composition of the invention is produced as an aqueous composition. The compositions of the invention can be made by dispersing or dissolving the components in water or a water blend. Preferably, the materials of the invention are made by dissolving or suspending the polyvinylpyridine polymer composition in an aqueous photoresist dispersion. The films of the invention can be made from such an aqueous material. For the purposes of this invention, the vehicle is the liquid continuous phase of the composition and can contain a major portion of water and other miscible co-solvents. The vehicle may also contain other conventional ingredients including dyes, wetting agents and may also comprise any number of other constituents. The aqueous vehicle is formulated to dry quickly and have a viscosity permitting ease of application. The polyvinyl polymer is suspended or emulsified in the aqueous phase. Generally, any liquid which will provide these functions without creating a volatile organic character in the composition may be used in accordance with the invention.

Various carriers include water, mono-, di-, and polyhydric alcohols such as methanol, ethanol, n-propanol and isopropanol, alkene and alkene glycols, and the like.

D. Photoreactive Compound

The stencil composition of the invention comprises a photosensitive compound to cure the stencil once it is placed on the screen. The preferred compound will be aqueous soluble and photoreactive when exposed to an actinic source of energy. The photosensitizing additives to be used in this invention may be low or high molecular weight substances.

Sensitizers commonly used in photopolymerizable resist compositions are monomers having photosensitive ethylenically unsaturated groups such as vinyl, acryloyl, methacryloyl, allyl, vinyl ether, acrylamide, or other groups or prepolymers thereof having an average degree of unsaturation of about 1 to 5. Examples of sensitizers having a single ethylenically unsaturated group include acrylamide, acrylic acid, methacrylic acid, methyl methacrylate, and methylol acrylamide. Preferred polyfunctional sensitizers have two or more photosensitive ethylenically unsaturated groups including sensitizers such as pentaerythritol triacrylate, pentaerythritol tetraacrylate, pentaerythritol trimethacrylate, pentaerythritol tetramethacrylate, 2,2,-dibromo methyl, 1,3-propane diacrylate, triallyl isocyanurate, N,N'-methylene bis-acrylamide, and prepolymers thereof. The most preferred sensitizer comprises pentaerythritol triacrylate.

The composition of the present invention can further comprise a diazo resin complex photocross-linking agent. As the diazo resin, water-soluble diazo resins formed by condensing diazotization products of diphenylamines such as p-aminodiphenylamine, 4-amino-4'-methyldiphenylamine, 4-amino-4'-ethyldiphenylamine, 4-amino-4'-methoxydiphenylamine, 4-amine-4'-chlorodiphenylamine and 4-amino-4'-nitrodiphenylamine with aldehydes such as p-formaldehyde, acetaldehyde, propionaldehyde and n-butylaldehyde can be used. The complexes can be formed between the above-discussed condensation products and sulfuric acid salts, phosphoric acid salts and zinc chloride double salts. The photocross-linking agent can be used in an amount of up to 20 parts per 100 parts of the light-sensitive heterocyclic quaternary group-added polymer.

Polymerization reaction initiators suitable for use in the invention are those materials which will easily generate free radicals upon exposure to heat or ultraviolet radiation. Examples of these initiators include benzoin-alkyl ethers, Michler's ketone, ditertiary butyl peroxide, dibenzothiazollyl-disulfide, dibromoacetophenone, anthraquinone, azobisisobutyronitrile, and the like. In a similar fashion the ethylenically unsaturated resists of this invention can contain optional functional compounds such as defoamers, surfactants, dyes, antioxidants, or other additives commonly used in this art.

Additional optional additives that can be used in the practice of this invention include surfactants used to increase the compatibility of the aqueous resist composition with the surface of the object and to promote an even coating. A defoamer can be used to insure that the layer of resist is free of small bubbles and other foamed species. A dye can be used to permit visualization of the position and approximate thickness of the resist composition. An antioxidant can be used for the preservation of the concentrations of the crosslinking activator.

The photoresist film comprising the photopolymer may be formed in any manner known to those skilled in the art including spraying, casting, reverse or roll coating, dipping, and doctor blading. Other methods of formation and photosensitive uses beyond those specifically disclosed herein will be recognized by the practitioner. These methods and uses of the invention are intended to be within the scope of the claims appended to the end of this specification.

There is no specific limitation for the amount of addition of these substances, but a preferable range is from about 10% to 50% by weight more preferably from about 10 wt-% to 30 wt-%, and most preferably from about 15 wt-% to 25 wt-%.

E. Vinyl Polymers

The aqueous photosensitive materials of the invention can contain a vinyl polymer in solution or dispersion form to aid in forming the images of the invention. Such vinyl polymers are film forming materials commonly used in aqueous solution or suspension.

In the case of copolymers, the copolymer may be a copolymer of two or more of the monomers disclosed below. There is no restriction on the copolymerization ratio between monomers. Further, the resulting copolymer must be soluble or dispersible in the aqueous resist.

Examples of suitable addition polymerizable monomers capable of copolymerizing with the vinylpyridine polymers of the general formulae (I through V) above which can be used include mono-olefin compounds such as ethylene, propylene, butene, etc.; diene compounds such as butadiene, isoprene, chloroprene, methoxybutadiene, cyclopentadiene, 1,3-cylcohexadiene, etc.; vinyl halide compounds such as vinyl chloride, vinyl bromide, vinyl fluoride, etc.; halopropene compounds such as 2-chloropropene, 1-chloropropene, 2-fluoropropene, etc.; vinyl ether compounds such as vinyl methyl ether, vinyl ethyl ether, vinyl n-propyl ether, vinyl isopropyl ether, vinyl n-butyl ether, vinyl isobutyl ether, vinyl tert-butyl ether, vinyl neopentyl ether vinyl 2-methoxyethyl ether, vinyl 2-chloroethyl ether vinyl 2,2,2-trifluoroethyl ether, vinyl benzyl ether, etc.; styrene compounds such as styrene, α-methylstyrene, 4-chlorostyrene, dichlorostyrene, 2,5-dimethoxystyrene, 4-methylstyrene, 4-ethylstyrene, etc.; aromatic vinyl compounds other than styrene, etc.; N-heterovinyl compounds other than the compounds represented by formulae (I) and (II) such as N-vinylcarbazole, N-vinylpyrrolidone, N-vinylpyridine, etc.; acrylic acid compounds such as acrylic acid, methacrylic acid, etc.; acrylic acid ester compounds such as methyl acrylate, ethyl acrylate, butyl acrylate, etc.; methacrylic acid esters such as methyl methacrylate, ethyl methacrylate, n-propyl methacrylate, n-butyl methacrylate, isobutyl, isobutyl methacrylate, n-hexyl methacrylate, 2-ethylbutyl methacrylate, n-lauryl methacrylate, 4-(tert-butyl)phenyl methacrylate, bornyl methacrylate, etc.; acrylonitrile compounds such as acrylonitrile, methacrylonitrile, etc.; acrylamide compounds such as acrylamide, N,N-dimethylacrylamide, N-(1,1-dimethyl-3-oxobutyl) acrylamide, etc., and the methacrylamides corresponding thereto; vinyl methyl ketone; methyl isopropenyl ketone; maleic anhydride; vinyl ester compounds such as vinyl acetate, vinyl chloroacetate, vinyl n-butyrate.

F. Acids

For the purposes of this invention, any organic or inorganic acid can be used that promotes the solubility of the nitrogen heterocycle containing polymer. Any of a large number of sources of acidity may be used to lower the pH of the aqueous solution used to maintain the solubility of the pyridinium salt prior to, and during deposition as well as reclaim the stencil composition. Both a Lewis acid, an electron pair acceptor, or a proton donor acid can be used. For the purposes of this invention a proton donor acid can be represented by the formula $H^+X^-$ wherein $H^+$ is an aqueous dissociable proton and $X^-$ is an anion. Such anions can include protonated anion such as $H_2PO_4^-$, $HSO_4^-$, etc.

Representative sources of acidity include inorganic and organic acids such as hydro- and hypo-chloric, and bromic acids, as well as, sulfuric acid, phosphoric acid, and nitrogen based acids among others. Organic acids useful in accordance with the invention include saturated and unsaturated aliphatic carboxylic acids including mono-, di-, and poly-carboxylic acids, acetic acid, fumaric acid, propionic acid, citric acid, malic acid, lactic acid and mixtures thereof.

Generally, to ensure the solubility of the pyridinium salt the pH of the stencil composition as well as the reclaim solution should be less than about 8, and preferably from about 2 to 7.

Blockout Product and Process

The unique solubility properties of polyvinylpyridine can be used in blockout processes and products. The blockout process involves forming a coating on a screen in a non-photosensitive process. Such processes are often used to repair flaws in images and to form borders or other large blockout areas required to successfully form an image on a substrate. The blockout processes are commonly practiced by applying a material containing a polymeric film forming material to the screen and drying the polymeric material into an intact film. We have found that the polyvinylpyridine materials of the invention can be used in such blockout materials to increase the water resistance of blockout products. Commonly a blockout product can comprise in a water base, a film forming polymer, a polyvinylpyridinium material, and optionally, acid if needed to form this pyridinium acid salt. A blend of polymeric materials can be used in the blockout material to optimize the film forming properties. Blockout materials on the screen can be reclaimed using an aqueous reclaiming acidic composition in the same reclaiming process as the image formed from the photosensitive materials. Any of the vinyl polymers having nitrogen heterocycle side groups can be used in forming the blockout products of the invention. The polymeric film forming compositions are all well known materials and are discussed above in the vinyl polymers.

Inks

In accordance with the invention, the stencil may be used with any number of aqueous alkaline ink compositions. Preferred ink compositions include those which are stable in an aqueous, alkaline median or carrier so as to not solubilize or otherwise detract from the developed stencil composition.

Useful inks include the Aquasoft 400 LF ink product series made by PANTONE, the SINVAQUA ink by SUMMIT, the 2500, 2700, 8500 and 9500 ink series sold by NA2-DAR, and other well known aqueous alkaline inks. The basicity of the inks causes the pyridine moiety of become insoluble. In blockout applications the polymer can be contacted with an alkaline solution to render the polymer insoluble. The solution can be made in any suitable aqueous liquid, water being preferred. The useful alkaline materials include any material that can produce an alkaline pH in the aqueous liquid. Conventional weak and strong bases can be used. Examples of suitable bases include inorganic bases such as NaOH, KOH, $NaCO_3$, $NaHCO_3$, $NH_4OH$, and organic bases such as monoethanol amine, diethanol amine, etc.

Screen Fabrication and Printing

The stencil composition of the invention may be used in any number of applications based upon screen printing. Non limiting examples include the following process.

Generally, screen stencils can be prepared by either applying an aqueous emulsion, containing a photosensitive material and the heterocyclic group containing polymer or polyvinylpyridine, to a screen mesh. Alternatively, a stencil can be made by applying a photoreactive or non-photoreactive water soluble film to the screen mesh. Non-photoreactive films can be imaged in a number of ways including hand cutting, hand painting, etc. The film or emulsion can be dried if necessary prior to exposure. The stencil can be exposed to actinic radiation using either a photopositive or photonegative method to transfer the image. The portion of the stencil to be removed (depending on the photopositive or photonegative nature of the exposure process) is developed or washed out with a waterstream until the undesirable portion of the stencil is completely removed. The image stencil is then dried and then applied in printing operations using preferably an alkaline ink. When contacted with an alkaline ink, the materials made from the aqueous emulsion obtained increase resistance to the effects of water due to the presence of the heterocyclic containing polymer or the polyvinylpyridine material. In an alternative preparatory method, after the film is developed or washed out with a water spray, the screen, either wet or dry, can be treated with a basic aqueous solution to further insolubilize the stencil prior to printing operations. The basic aqueous solution can be applied to either a wet or dry screen. However, preferably the aqueous alkaline solution is applied directly to a wet screen immediately after development. The non-photosensitive heterocycle containing polymers or polyvinylpyridine are more easily converted into an insoluble form when exposed to the alkaline solution in an aqueous medium. The alkaline aqueous solution is allowed to soak into the screen for a period of time. The solution may be applied either by spraying the solution directly on the screen or by the application of some material directly onto the screen by wetting, blotting, dipping or immersing the screen into a volume of the alkaline aqueous solution. After a period of time sufficient to ensure that the non-photosensitive polymers are sufficiently converted into the free pyridine form, the alkaline aqueous material can be washed from the screen with a water rinse. The stencil can be dried and can be printed immediately with an alkaline water based ink.

WORKING EXAMPLES

The following working examples are provided to further illustrate the various characteristics and attributes of the invention. These working examples should not be construed as limiting but rather as merely illustrative of the invention.

Comparative Preparation

Mixtures of the following components were made by agitation at 1000 R.P.M. for a period of 25 minutes. The components were mixed in the order they are listed.

| Constituent | Wt-% |
| --- | --- |
| Polyvinyl alcohol | 73.17 |
| Dye | 0.06 |
| Polyvinyl acetate | 21.53 |
| Surfactant | 0.12 |
| Alcohol | 0.71 |
| Water | 4.05 |
| Diazo | 0.36 |

Example #1 represents a solvent/water resistant screen printing stencil preparation in accordance with the invention.

EXAMPLE 1

A portion of the polyvinyl alcohol in the comparative example is substituted with polyvinylpyridine (25% active in a methanol solution) and phosphoric acid. The remaining ratios of components remain the same ensuring that the only change is substitution of polyvinyl alcohol through the addition of polyvinylpyridine.

| Constituent | Wt-% |
| --- | --- |
| Polyvinyl Pyridine | 5.35 |
| $H_3PO_4$ | 0.52 |
| Polyvinyl alcohol | 67.30 |
| Polyvinyl acetate | 21.53 |
| Dye | 0.06 |
| Surfactant | 0.21 |
| Alcohol | 0.71 |
| Water | 4.05 |
| Diazo | 0.36 |

Compositions described in example 1 and the comparative example were applied to a screen of 110 mesh made of polyester, dried, exposed to a pattern of light and washed with water to obtain a clear negative image. Materials were then printed, side by side, with water-based ink (pH>8), alkaline. By the action of the printing with the ink, the polyvinylpyridine salt, which was made soluble in water by the acid to ensure addition to the emulsion, is converted back to its water insoluble form, thereby making the resist water-resistant. The materials were printed until the failure of the comparative resist mixture. The resist mode of Example 1 was producing sharp images, therefore proving the water-resistance of the Example 1 mixture.

EXAMPLE 2

The composition formulated in example 1 was applied to a screen of 110 mesh made of polyester, dried, exposed to a pattern of light and washed with water to obtain a clear negative image and dried. Water-based alkaline ink was applied to one half of the imaged screen and the other half was left uncovered. The ink was left on the stencils for a period of one hour. After one hour the ink was cleaned off the screen with a suitable screen wash. The stencils were then tested by double rubs with water. The treated area was more resistant to water than the non-treated area.

EXAMPLES 3A and 3B

The following examples are further examples of compatible systems for the invention. These examples employ a light-sensitive styryl pyridinium polymer in place of the Polyvinyl alcohol/Diazo used in Examples 1–3. Also, the amount of polyvinylpyridine was increased to further maintain the water resistance. The following describes more methods to prove/test the water resistance.

Mixtures of the following components were made by agitation at 1000 R.P.M. for a period of 25 minutes. Polyvinylpyridine was mixed with acetic acid and the final solution was added to the other components in the order they are listed.

| EXAMPLE | 3A | 3B |
| --- | --- | --- |
| Acetic acid | 0.99 | 0.99 |
| Polyvinylpyridine | 19.78 | 19.78 |
| SPP-H-13 | 24.73 | 14.83 |
| Polyvinyl acetate 320 | 54.39 | 64.27 |
| Dye | 0.12 | 0.14 |

EXAMPLE 4

The compositions from examples 3A and 3B were applied to a screen of 110 mesh and exposed to a pattern of light and washed with water.

Each applied coating was divided in half and one half of each was exposed to a spraying of a 10% solution in water of sodium carbonate. This was then allowed to stand for a period of 30 minutes. The screens were then washed with water of between 800–1200 p.s.i. and it was discovered that the screen portions which were treated with the sodium carbonate were more water resistant than the non-treated areas.

EXAMPLE 5

This example demonstrates the action of acid on polyvinylpyridine with respect to solubility and insolubility.

A preparation of polyvinylpyridine and stoichiometric amount of acetic acid was coated on polyester carrier. The coating was then allowed to dry at room temperature. Next, the film was peeled off the carrier and placed in a volume of water. The film was completely solubilized.

Next, the same film was further dried at a temperature of 60 degrees C. for one hour and the test was repeated. The film was then water-insoluble.

The acetic acid, which was used to make an active salt of the pyridine (quaternize the pyridine), can be driven off as an acetic acid vapor, and the polyvinylpyridine is made insoluble again.

EXAMPLE 6

The composition described in examples 3A and 3B were applied to a screen of 110 mesh made of polyester that was exposed to a pattern of light and washed with water. One screen was dried at room temperature and one was dried at 60 degrees C. for one hour. The screens were exposed to a water spray at 800–1200 p.s.i. with the screen coatings dried at 60 degrees C. showing more water resistance than the room temperature dried coatings.

EXAMPLE 7

A non-photosensitive blockout composition that can be used to selectively cover portions of a screen or repair flaws in an image can include 23.27 wt-% of a 25 wt-% active methanolic solution of polyvinylpyridine, 1.09 wt-% of acetic acid, 46.54 wt-% of a polyvinyl acetate, 11.64 wt-% of a polyvinyl alcohol and 17.45 wt-% water.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An aqueous screen printing composition consisting essentially of:
   (a) at least about 5 wt-% of an aqueous soluble or dispersible vinyl polymer comprising repeating units having a pendant nitrogen heterocycle in the form of an acid salt, said polymer is aqueous insoluble at an alkaline pH;
   (b) an effective image forming amount of a photosensitive composition which is aqueous soluble and photoreactive when exposed to an actinic source of energy, and
   (c) a vinyl polymer consisting essentially of repeating units derived from vinyl monomers selected from the group consisting of a mono olefin, a diene, a vinyl halide, a vinyl ether, a styrene, an acrylic acid, an acrylic acid eater, an acrylonitrile, an acrylamide, a vinyl ketone, a vinyl acid anhydride, and mixtures thereof.

2. The composition of claim 1 wherein the polymer has a degree of polymerization of about 50 to 100,000.

3. The composition of claim 1 wherein the vinyl polymer is a polyvinyl pyridinium.

4. A composition of claim 3 wherein the polyvinyl pyridinium comprises a polyvinyl pyridinium chloride, a polyvinyl pyridinium sulfate, a polyvinyl pyridinium acetate or mixtures thereof.

5. The composition of claim 3 wherein the molecular weight of a polyvinyl pyridinium is about $10^4$ to about $10^6$.

6. The composition of claim 1 wherein the vinyl polymer comprises a polyvinyl alcohol, a polyvinyl acetate or a poly(ethylene-co-vinyl acetate).

7. The composition of claim 1, wherein said composition has a pH of about 8 or less.

8. The composition of claim 3 wherein said polyvinyl pyridinium compound is a homopolymer.

9. A screen printing film consisting essentially of an effective image forming amount of:
   (a) at least 5 wt-% of an aqueous soluble or dispersible polyvinyl pyridinium compound in the form of an acid salt, wherein said polyvinyl pyridinium compound is aqueous insoluble at an alkaline pH;
   (b) an effective image forming amount of a photosensitive composition which is aqueous soluble and photoreactive when exposed to an actinic source of energy, and
   (c) a vinyl polymer consisting essentially of repeating units derived from vinyl monomers selected from the group consisting of a mono olefin, a diene, a vinyl halide, a vinyl ether, a styrene, an acrylic acid, an acrylic acid ester, an acrylonitrile, an acrylamide, a vinyl ketone, a vinyl acid anhydride, and mixtures thereof.

10. A film of claim 9 wherein the polyvinyl pyridinium comprises a polyvinyl pyridinium chloride, a polyvinyl pyridinium sulfate, a polyvinyl pyridinium acetate or mixtures thereof.

11. The film of claim 10 wherein the molecular weight of a polyvinyl pyridinium is about $10^4$ to about $10^6$.

12. A film of claim 9 wherein the vinyl polymer comprises a polyvinyl alcohol, a polyvinyl acetate or a poly(ethylene-co-vinyl acetate).

13. The film of claim 9 wherein said polyvinyl pyridinium compound is a homopolymer.

14. An aqueous screen printing composition consisting essentially of:
   (a) at least about 5 wt-% of an aqueous soluble or dispersible polyvinyl pyridinium compound having a molecular weight of about $10^4$ to about $10^6$ in the form of an acid salt, wherein said polyvinyl pyridinium compound is aqueous insoluble at an alkaline pH;
   (b) an effective image forming amount of a photosensitive composition which is aqueous soluble and photoreactive when exposed to an actinic source of energy, and
   (c) a vinyl polymer selected from the group consisting of polyvinyl alcohol, polyvinyl acetate, and a mixture thereof.

* * * * *

UNITED STATES PATENT AND TRADEMARK OFFICE
CERTIFICATE OF CORRECTION

PATENT NO. : 6,503,683 B1
DATED : January 7, 2003
INVENTOR(S) : Gybin et al.

It is certified that error appears in the above-identified patent and that said Letters Patent is hereby corrected as shown below:

<u>Column 9,</u>
Line 25, "cylcohexadiene" should read -- cyclohexadiene --

<u>Column 14,</u>
Line 2, "acid eater" should read -- acid ester --

Signed and Sealed this

Twenty-second Day of April, 2003

JAMES E. ROGAN
*Director of the United States Patent and Trademark Office*